(12) United States Patent
Hong et al.

(10) Patent No.: US 12,406,880 B2
(45) Date of Patent: Sep. 2, 2025

(54) DIELECTRIC SILICON NITRIDE BARRIER DEPOSITION PROCESS FOR IMPROVED METAL LEAKAGE AND ADHESION

(71) Applicant: Texas Instruments Incorporated, Dallas, TX (US)

(72) Inventors: Qi-Zhong Hong, Richardson, TX (US); Joseph Jian Song, Plano, TX (US); Gregory Boyd Shinn, Dallas, TX (US); Bhaskar Srinivasan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 409 days.

(21) Appl. No.: 17/751,976

(22) Filed: May 24, 2022

(65) Prior Publication Data

US 2023/0386907 A1 Nov. 30, 2023

(51) Int. Cl.
*H01L 21/768* (2006.01)
*H01L 21/02* (2006.01)
*H01L 23/522* (2006.01)
*H01L 23/532* (2006.01)

(52) U.S. Cl.
CPC .... *H01L 21/76829* (2013.01); *H01L 21/0217* (2013.01); *H01L 21/02274* (2013.01); *H01L 21/76877* (2013.01); *H01L 23/5226* (2013.01); *H01L 23/53238* (2013.01)

(58) Field of Classification Search
CPC ........... H01L 21/76829; H01L 21/0217; H01L 21/02274; H01L 21/76877; H01L 23/5226; H01L 23/53238; H01L 21/76883; H01L 21/76826; H01L 21/02312; H01L 21/02211; H01L 21/76834; H01L 23/53295
See application file for complete search history.

(56) References Cited

U.S. PATENT DOCUMENTS

| 7,309,651 | B2  | 12/2007 | West et al. |
| 2006/0027924 | A1* | 2/2006 | Chen ............... H01L 21/288 257/E21.174 |
| 2006/0154471 | A1* | 7/2006 | Minami ............ H01L 21/76807 438/618 |
| 2006/0166491 | A1* | 7/2006 | Ida ................. H01L 21/76801 257/E21.579 |
| 2007/0037388 | A1* | 2/2007 | Hohage ............. C23C 16/0227 257/E21.224 |
| 2012/0205814 | A1* | 8/2012 | Wu ................. H01L 21/02203 438/653 |
| 2013/0221535 | A1* | 8/2013 | Ma ................. H01L 23/53295 428/408 |
| 2017/0125450 | A1* | 5/2017 | Hodo ............... H10D 86/0231 |

(Continued)

*Primary Examiner* — Douglas W Owens
(74) *Attorney, Agent, or Firm* — Xiaotun Qiu; Frank D. Cimino

(57) ABSTRACT

An electronic device includes a semiconductor die having a multilevel metallization structure including stacked levels with respective dielectric layers and metal lines, and a low leakage, low hydrogen diffusion barrier layer on one of the stacked levels. The diffusion barrier layer contacts a side of the dielectric layer and the metal line of the one of the stacked levels, and the diffusion barrier layer includes silicon nitride material having a first bond percentage ratio of ammonia to silicon nitride that is greater than a second bond percentage ratio of silicon hydride to silicon nitride.

20 Claims, 19 Drawing Sheets

(56) References Cited

U.S. PATENT DOCUMENTS

2020/0066987 A1* 2/2020 Sims ................... C23C 16/4554
2021/0257293 A1* 8/2021 Lee ................... H01L 21/76829
2023/0121958 A1* 4/2023 Lee ................... H01L 21/02178
257/758

* cited by examiner

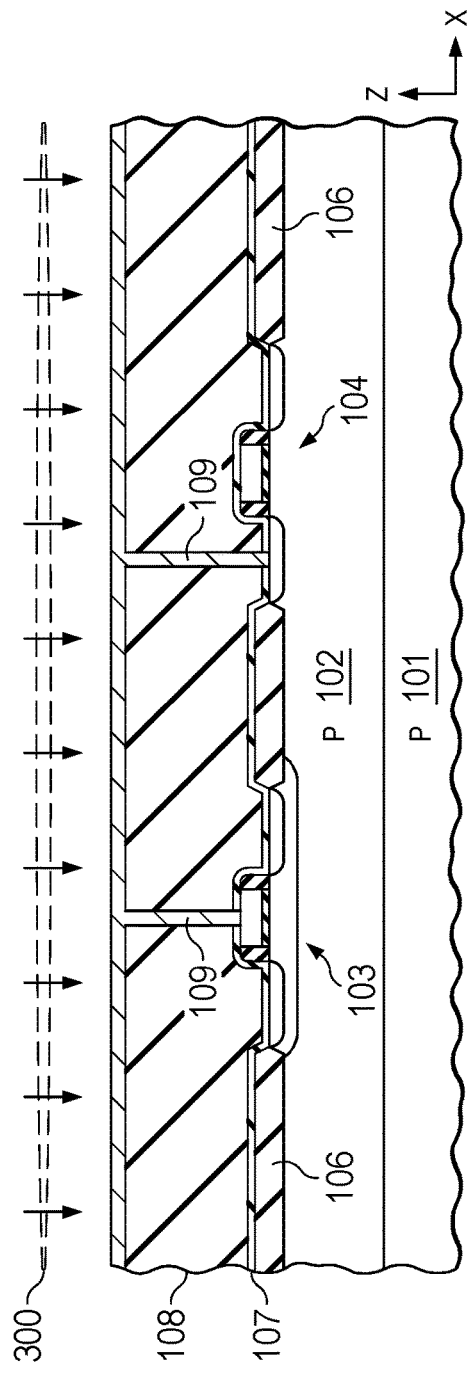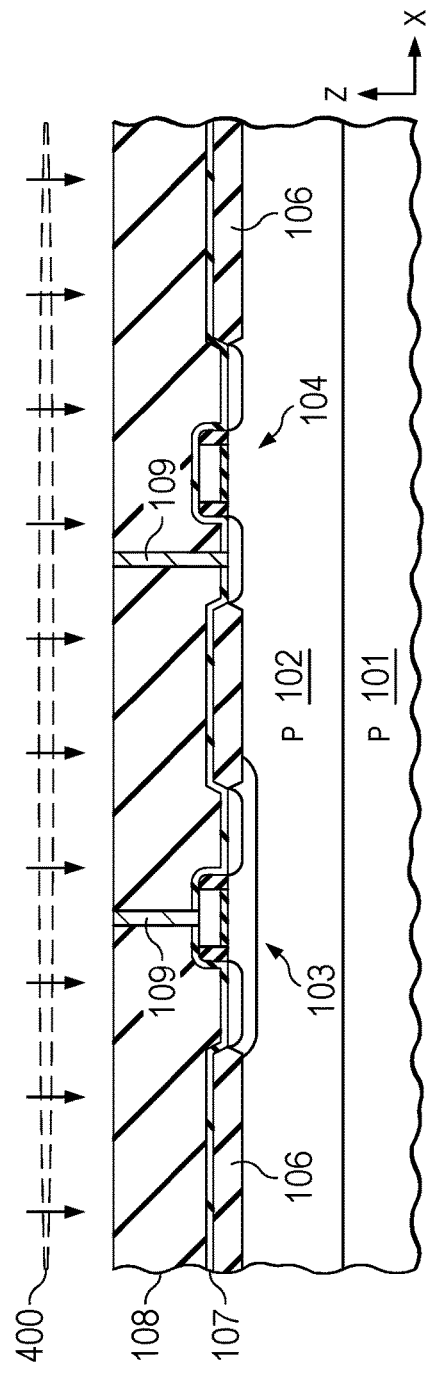

DIELECTRIC SILICON NITRIDE BARRIER DEPOSITION PROCESS FOR IMPROVED METAL LEAKAGE AND ADHESION

BACKGROUND

Diffusion barriers are used in integrated circuits to mitigate diffusion of material from metal structures, such as copper metal lines or vias. In operation, current leakage can cause undesirable circuit performance, including intra-metal leakage across metal lines of a given metallization level and inter-metal current leakage between levels. Diffusion barriers can contribute to current leakage, and intra-metal current leakage can be more pronounced at high voltages.

SUMMARY

In one aspect, an electronic device includes a semiconductor die, a package structure, and a conductive lead. The package structure encloses a portion of the semiconductor die. The conductive lead is partially exposed outside the package structure and is electrically connected to a conductive feature of the semiconductor die. The semiconductor die has a multilevel metallization structure that includes stacked levels with respective dielectric layers and metal lines, and a diffusion barrier layer on one of the levels. The diffusion barrier layer contacts a side of the dielectric layer and a side of the metal line of the one of the levels. The diffusion barrier layer includes silicon nitride material having a first bond percentage ratio of ammonia to silicon nitride that is greater than a second bond percentage ratio of silicon hydride to silicon nitride.

In another aspect, an electronic device includes first and second metallization levels and a diffusion barrier layer in a semiconductor die. The first metallization level has a first dielectric layer and a first metal line. The diffusion barrier layer contacts a side of the first dielectric layer and a side of the first metal line. The diffusion barrier layer includes silicon nitride material that has a first bond percentage ratio of ammonia to silicon nitride of 6.5% or more and 10% or less, and a second bond percentage ratio of silicon hydride to silicon nitride of 1.5% or more and 1.9% or less. The second metallization level has a second dielectric layer on the diffusion barrier layer.

In a further aspect, a method of fabricating an electronic device includes forming a diffusion barrier layer on a side of a first dielectric layer and on a side of a first metal line, the diffusion barrier layer including silicon nitride material has a first bond percentage ratio of ammonia to silicon nitride of 6.5% or more and 10% or less, and a second bond percentage ratio of silicon hydride to silicon nitride of 1.5% or more and 1.9% or less, and forming a second dielectric layer on the diffusion barrier layer.

BRIEF DESCRIPTION OF THE DRAWINGS

FIGS. 3-18 are partial sectional side elevation views of a semiconductor wafer undergoing processing according to the method of FIG. 2.

DETAILED DESCRIPTION

Figure 1:
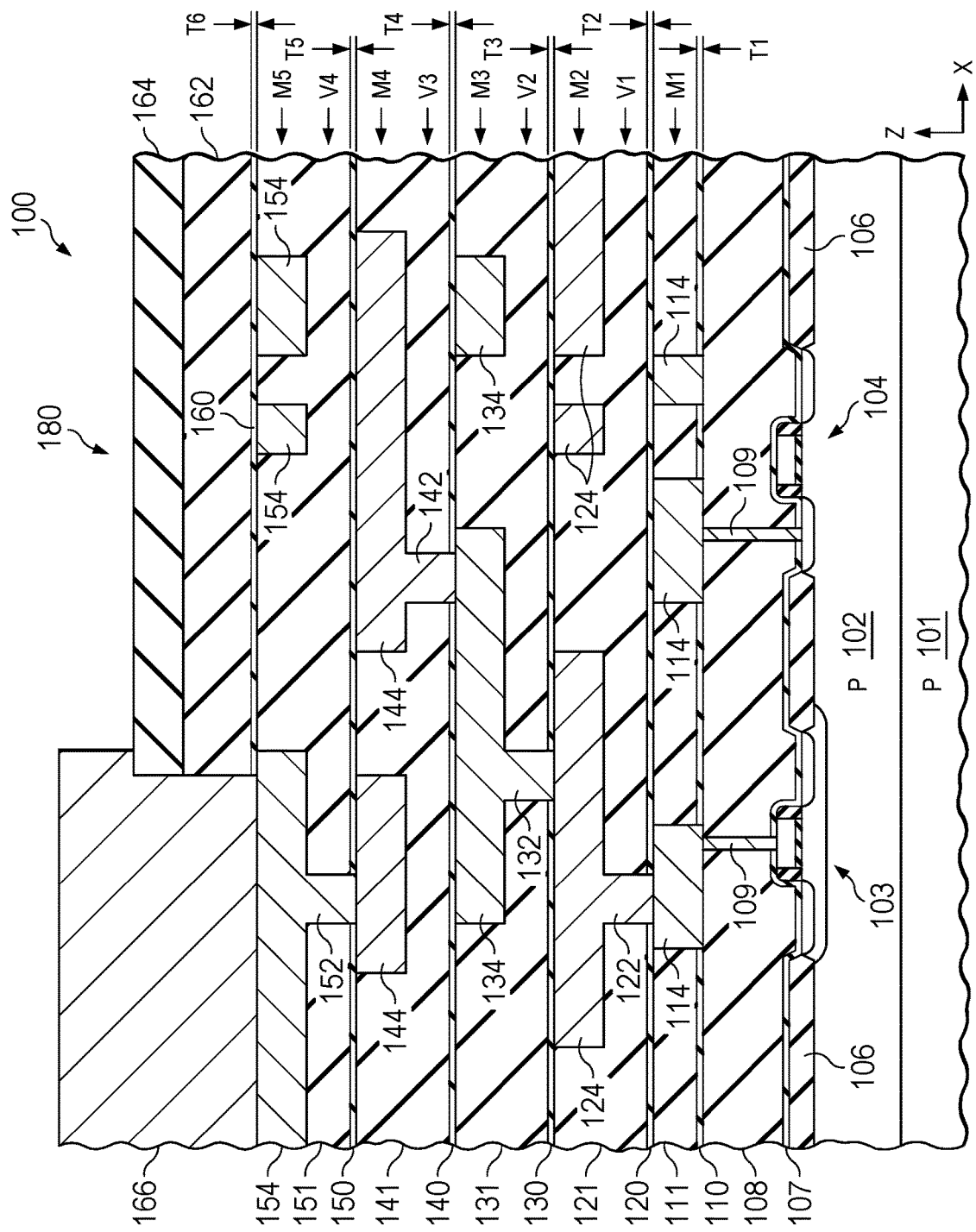
FIG. 1 is a partial sectional side elevation view of a semiconductor die in an integrated circuit or other electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material. Unless otherwise stated, "about," "approximately," or "substantially" preceding a value means+/−10 percent of the stated value.

Described electronic devices and methods provide a solution to mitigate inter-metal and intra-metal current leakage using a low leakage, low hydrogen diffusion barrier layer between metallization levels with reduced silicon-hydrogen bonds. In certain implementations, a short silane pretreatment before deposition of the low leakage, low hydrogen silicon nitride or silicon carbon nitride diffusion barrier layer materials provide further benefits of improved adhesion and electromigration reliability without significant adverse impact to metal resistance. In certain examples, the diffusion barrier layer mitigates diffusion of copper metal materials in a multilevel metallization structure during operation and/or production and also operates as an etch stop layer during device fabrication.

Figure 1A:
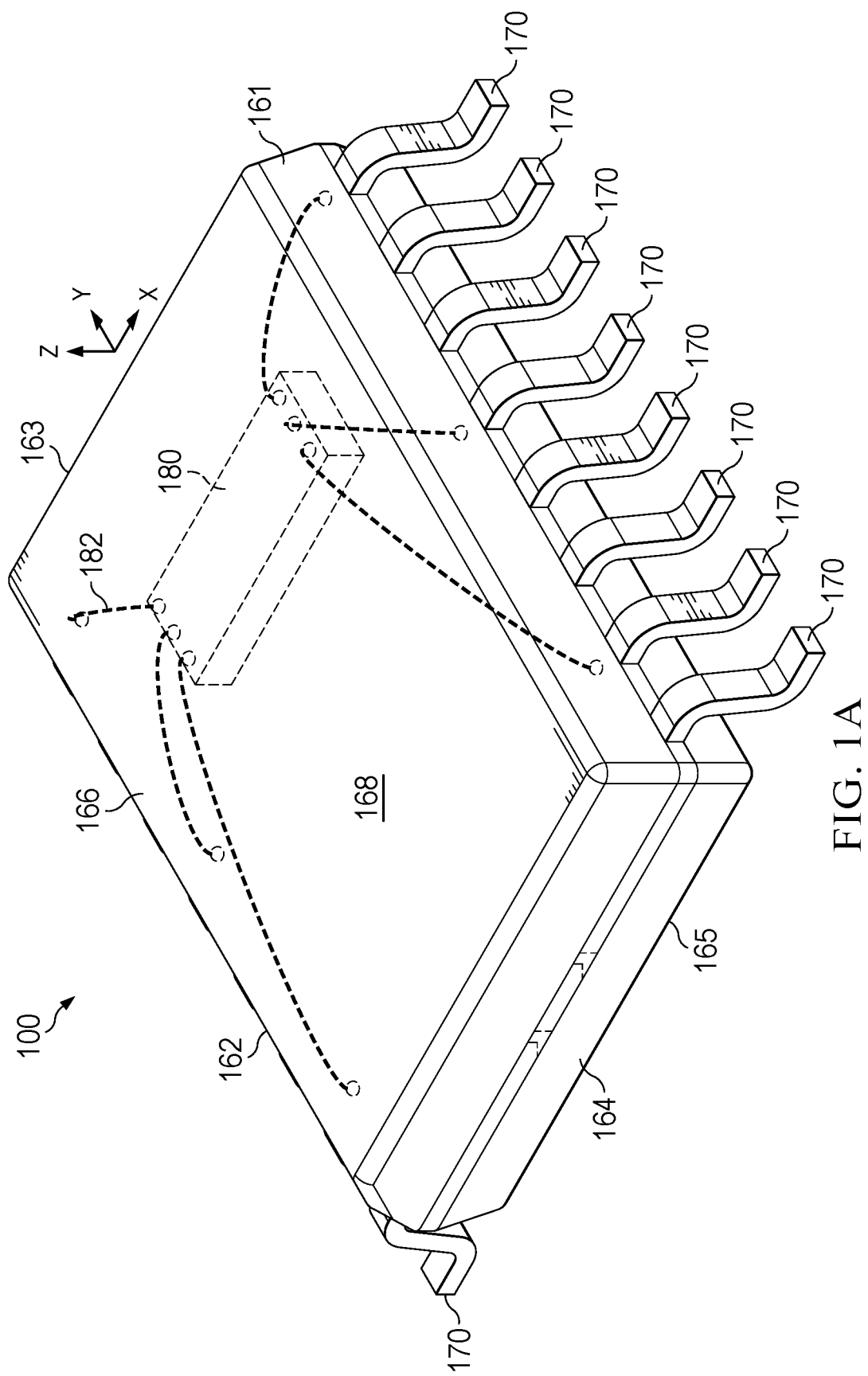
FIG. 1A is a top perspective view of the electronic device and semiconductor die of FIG. 1.

FIGS. 1 and 1A illustrate a packaged electronic device 100, such as an integrated circuit with a semiconductor die 180. As best shown in FIG. 1, the semiconductor die 180 includes a semiconductor substrate with a first semiconductor layer 101 and a semiconductor surface layer 102. The semiconductor layers 101 and 102 include semiconductor material (e.g., silicon, gallium nitride, etc.) doped by implantation and/or diffusion with dopants of a first conductivity type (e.g., p). In another implementation (not shown), one or both of the semiconductor layers 101 and/or 102 can be doped with dopants of an opposite second conductivity type (e.g., n). The electronic device 100 includes one or more electronic components such as transistors 103 and 104 that are formed on and/or in the semiconductor surface layer 102, along with isolation structures 106 (e.g., shallow trench isolation or STI structures, field oxide structures, etc.). The electronic device 100 in the illustrated example further includes a pre-metal dielectric (PMD) liner layer 107 that extends above (e.g., on) portions of the isolation structures 106 and the transistors 103 and 104. In one example, the PMD liner layer 107 is or includes silicon nitride (SiN or stoichiometric variations thereof). A PMD dielectric layer 108 extends above (e.g., on) the PMD liner layer 107. In one example, the PMD dielectric layer 108 is or includes phosphosilicate glass (PSG) or borophosphosilicate glass (BPSG). Tungsten (W) or other conductive contacts 109 extend through the PMD dielectric layer 108 to form electrical contacts or connections to terminals (e.g., gate, source, drain) of the transistors 103 and 104.

A multilevel metallization interconnect structure extends above the PMD level. The metallization structure includes a first etch stop layer 110 that extends over the PMD dielectric layer 108 and forms an etch stop structure during fabrication of openings for first metal lines (e.g., labeled M1 in FIG. 1). In one example, the first etch stop layer 110 is or includes a low hydrogen, low leakage silicon nitride material (e.g., Si—N, such as SiN) or silicon carbon nitride material (e.g., SiCN) having a first bond percentage ratio of ammonia (e.g., N—H, such as NH$_3$) to silicon nitride that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The first etch stop layer 110 has a first thickness T1, for example, approximately 600 Å. The first level of the metallization interconnect structure extends over the first etch stop layer 110 and includes a first inter-metal dielectric (IMD) dielectric layer 111 and metal lines 114. In one example, the IMD dielectric layer 111 is or includes one of fluorosilicate glass (FSG), tetraethyl orthosilicate (TEOS), and silicon oxycarbide (e.g., SiCO). In the illustrated example, the first metal lines 114 are or include copper. In another example, a different conductive metal can be used, such as aluminum. Some of the illustrated first metal lines 114 in one example extend partially over, and directly contact, respective ones of the tungsten contacts 109 to form electrical connections thereto as shown in FIG. 1.

The multilevel metallization interconnect structure includes further levels arranged in a stacked configuration as shown in FIG. 1. A diffusion barrier layer 120 extends over the first metallization level and contacts an upper side of the dielectric layer 111 and upper sides of the first metal lines 114. The diffusion barrier layer 120 has a thickness T2, for example, approximately 600 Å. The diffusion barrier layer 120 operates as an etch stop structure used during fabrication of openings for first vias (e.g., labeled V1 in FIG. 1). The diffusion barrier layer 120 is or includes a low hydrogen, low leakage silicon nitride material (e.g., SiN) or silicon carbon nitride material (e.g., SiCN) having a first bond percentage ratio of ammonia (e.g., N—H such as NH$_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The second level of the metallization interconnect structure extends over the diffusion barrier layer 120 and includes a second dielectric layer, referred to as an inter-level dielectric (ILD) layer 121 as well as the conductive metal first vias 122 (e.g., V1) and second metal lines 124 (e.g., labeled M2). In one example, the ILD dielectric layer 121 is or includes one of fluorosilicate glass (FSG), tetraethyl orthosilicate (TEOS), and silicon oxycarbide (e.g., SiCO). In the illustrated example, the first vias 122 and the second metal lines 124 are or include copper. In another example, a different conductive metal is used, such as aluminum.

The third level in this example includes another diffusion barrier layer 130 that extends over the second metallization level and contacts an upper side of the dielectric layer 121 and upper sides of the second metal lines 124. The diffusion barrier layer 130 has a thickness T3, for example, approximately 600 Å. The diffusion barrier layer 130 operates as an etch stop structure used during fabrication of openings for second vias 132 (e.g., labeled V2 in FIG. 1). The diffusion barrier layer 130 is or includes a low hydrogen, low leakage silicon nitride material (e.g., SiN) or silicon carbon nitride material (e.g., SiCN) having a first bond percentage ratio of ammonia (e.g., N—H such as NH$_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The third level of the metallization interconnect structure extends over the diffusion barrier layer 130 and includes a second ILD dielectric layer 131 as well as the conductive metal second vias 132 (e.g., labeled V2) and conductive third metal lines 134 (e.g., M3). In one example, the ILD dielectric layer 131 is or includes one of fluorosilicate glass (FSG), tetraethyl orthosilicate (TEOS), and silicon oxycarbide (e.g., SiCO). In the illustrated example, the second vias 132 and the third metal lines 134 are or include copper. In another example, a different conductive metal is used, such as aluminum.

A fourth metallization structure level includes a diffusion barrier layer 140 that extends over the third metallization level and contacts an upper side of the dielectric layer 131 and upper sides of the third metal lines 134. The diffusion barrier layer 140 has a thickness T4, for example, approximately 600 Å. The diffusion barrier layer 140 operates as an etch stop structure used during fabrication of openings for third vias 142 (e.g., labeled V3). The diffusion barrier layer 140 is or includes a low hydrogen, low leakage silicon nitride material (e.g., SiN) or silicon carbon nitride material (e.g., SiCN) having a first bond percentage ratio of ammonia (e.g., N—H such as NH$_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The fourth level of the metallization interconnect structure extends over the diffusion barrier layer 140 and includes a third ILD dielectric layer 141 as well as the conductive metal third vias 142 (e.g., labeled V3) and conductive fourth metal lines 144 (e.g., M4). In one example, the ILD dielectric layer 141 is or includes one of fluorosilicate glass (FSG), tetraethyl orthosilicate (TEOS), and silicon oxycarbide (e.g., SiCO). In the illustrated example, the third vias 142 and the fourth metal lines 144 are or include copper. In another example, a different conductive metal is used, such as aluminum.

A fifth metallization structure level includes another diffusion barrier layer 150 that extends over the fourth metallization level and contacts an upper side of the dielectric layer 141 and upper sides of the fourth metal lines 144. The diffusion barrier layer 150 has a thickness T5, for example, approximately 600 Å. The diffusion barrier layer 150 operates as an etch stop structure used during fabrication of openings for fourth vias 152 (e.g., labeled V4). The diffusion barrier layer 150 is or includes a low hydrogen, low leakage silicon nitride material (e.g., SiN) or silicon carbon nitride material (e.g., SiCN) having a first bond percentage ratio of ammonia (e.g., N—H such as $NH_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The fifth level of the metallization interconnect structure extends over the diffusion barrier layer 150 and includes a fourth ILD dielectric layer 151 as well as the conductive metal fourth vias 152 (e.g., V4) and fifth metal lines 144 (e.g., M5). In one example, the ILD dielectric layer 151 is or includes one of fluorosilicate glass (FSG), tetraethyl orthosilicate (TEOS), and silicon oxycarbide (e.g., SiCO). In the illustrated example, the fourth vias 152 and fifth metal lines 154 are or include copper. In another example, a different conductive metal can be used, such as aluminum.

The electronic device 100 further includes another etch stop and diffusion barrier layer 160 with a thickness T6 (e.g., approximately 600 Å) that extends over a portion of the ILD dielectric layer 151 and top sides of portions of some of the fifth metal lines 154. The etch stop and diffusion barrier layer 160 is or includes a low hydrogen, low leakage silicon nitride material (e.g., SiN) or silicon carbon nitride material (e.g., SiCN) having a first bond percentage ratio of ammonia (e.g., N—H such as $NH_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). A protective overcoat oxide layer 162 extends over the etch stop and diffusion barrier layer 160, and a protective overcoat silicon oxynitride layer 164 (e.g., SiON) extends over the protective overcoat oxide layer 162. A conductive metal cap structure 166 extends over and electrically contacts a portion of an upper side of one of the fifth metal lines 154. In one example, the metal Structure 166 is or includes aluminum. In another example, a different conductive metal is used.

As further shown in FIG. 1A, the electronic device 100 as a molded package structure 168 and conductive gullwing leads 170. The electronic device 100 is illustrated in FIGS. 1 and 1A in an example position in a three-dimensional space with respective first, second, and third mutually orthogonal directions X, Y, and Z. As best shown in FIG. 1A, the electronic device 100 includes opposite first and second sides 161 and 162 that extend along the second direction Y and are spaced apart from one another along the first direction X. The electronic device 100 also includes third and fourth sides 163 and 164 spaced apart from one another along the second direction Y, as well as a bottom side 165, and a top side 166 spaced apart from the bottom side 165 along the third direction Z. In the illustrated example, the bottom and top sides 165 and 166 are generally planar and extend in respective X-Y planes of the first and second directions X and Y. The electronic device 100 includes gullwing type conductive leads 170 along the first side 161, as well as along the opposite second side 162. The example gullwing leads 170 are or include conductive metal, such as aluminum or copper, and have internal portions enclosed by the molded package structure 168 as well as external portions partially exposed outside the package structure 168. The semiconductor die 180 in this example has conductive features such as conductive bond pads that are electrically connected to respective ones of the conductive leads 170 via bond wires 182.

The low leakage (LL), low hydrogen SiN or SiCN material of the layers 110, 120, 130, 140, 150, and 160 have reduced (e.g., less) Si—H bonds compared with previously used silicon nitride at stop/diffusion barrier layers, and the reduced hydrogen bonds help to mitigate intra-metal and inter-metal leakage in operation. Moreover, the low leakage, low hydrogen diffusion barrier layers side affective protection against copper diffusion and also serve as at stop layers during fabrication of the electronic device 100. In certain examples, one or more of the layers 110, 120, 130, 140, 150, and/or 160 are formed by deposition processing following a short silane treatment to provide improved adhesion of the overlying subsequently deposited dielectric layer with limited increase in metal resistance. Unlike reduced hydrogen layer usage in preventing negative effects of hydrogen on PZT or other ferroelectric materials used in ferroelectric memory applications, the low hydrogen, low leakage silicon nitride or silicon carbon nitride material in the electronic device 100 advantageously mitigates both intra-metal and inter-metal current leakage in operation of the electronic device 100, particularly in high voltage integrated circuits.

Referring also to FIGS. 2-18, FIG. 2 shows a method 204 fabricating an electronic device, and FIGS. 3-18 illustrate the electronic device 100 undergoing fabrication processing according to the method 200. In FIGS. 3-18, the device is illustrated in wafer form prior to individual electronic devices being separated from a processed wafer and subsequently packaged to form a packaged electronic device 100 as shown in FIGS. 1-1A.

The method 200 includes front end of the line (FEOL) device fabrication at 202, including processing steps (not shown) to fabricate the transistors 103 and 104 on or in the semiconductor surface layer 102 as shown in FIG. 3. The method 200 continues in FIG. 2 with pre-metal dielectric processing, including depositing a silicon nitride PMD liner layer at 211 (e.g., PMD liner layer 107 in FIG. 3), depositing the PMD dielectric layer at 212 (e.g., PMD dielectric layer 108), and planarization such as chemical mechanical polishing (CMP) at 213 in FIG. 2. The PMD processing at 210 in this example also includes contact patterning and etching to form contact openings through the PMD dielectric layer 108 at 214, deposition of tungsten or other conductive metal to fill the contact openings at 215. FIG. 3 shows one example, in which a tungsten deposition process 300 is performed that deposits tungsten in the etched openings of the PMD dielectric layer 108. The deposition process 300 forms further tungsten along the top side of the PMD dielectric layer 108 as shown in FIG. 3. The PMD processing at 210 in FIG. 2 further includes planarization such as CMP processing at 216. FIG. 4 shows one example, in which a CMP process 400 is performed that planarizes the top side of the processed wafer and exposes the top sides of the remaining tungsten contacts 109 and the PMD dielectric layer 108.

Figure 2:
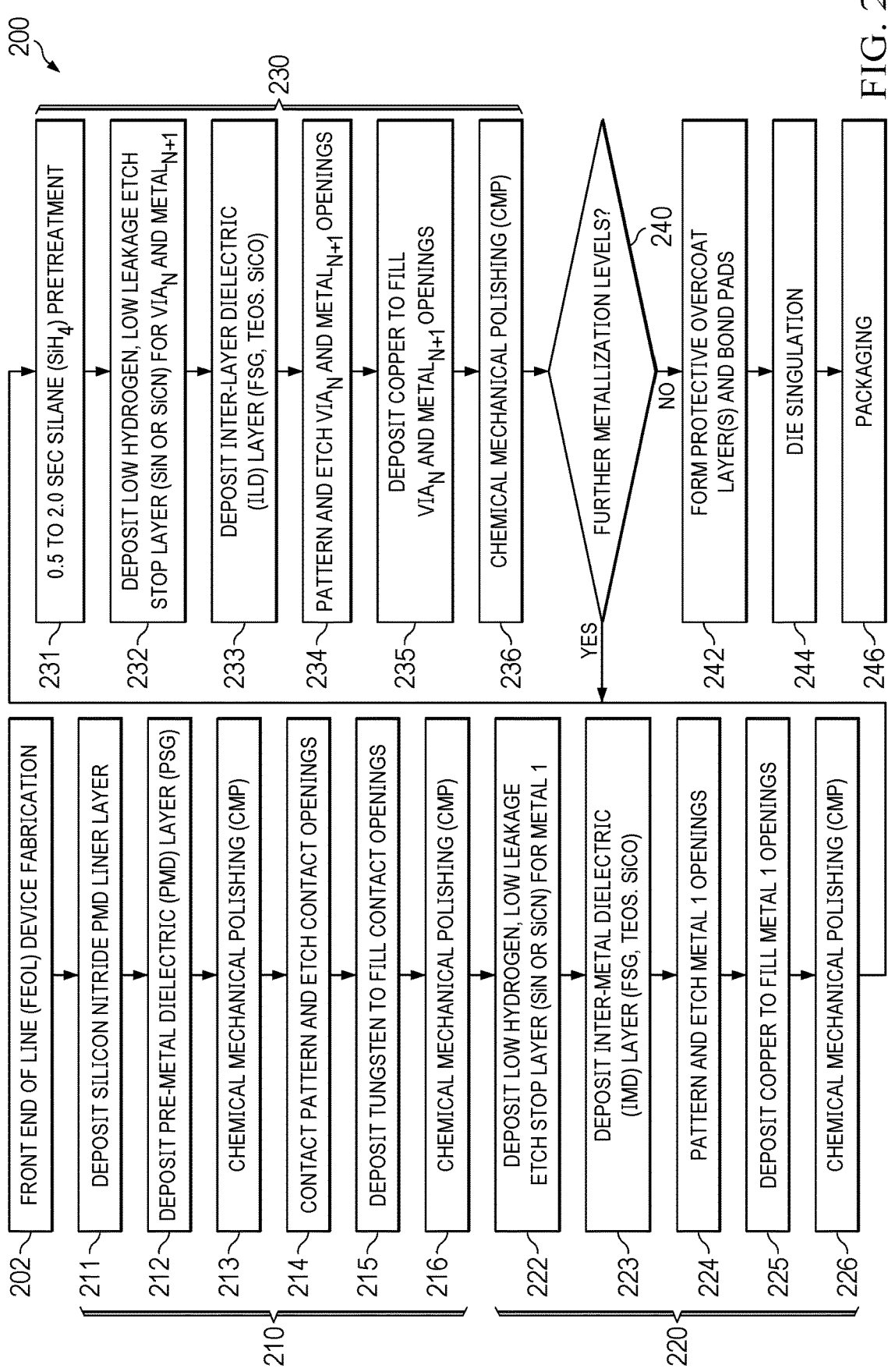
FIG. 2 is a flow diagram of a method of fabricating an electronic device.
Figure 5:
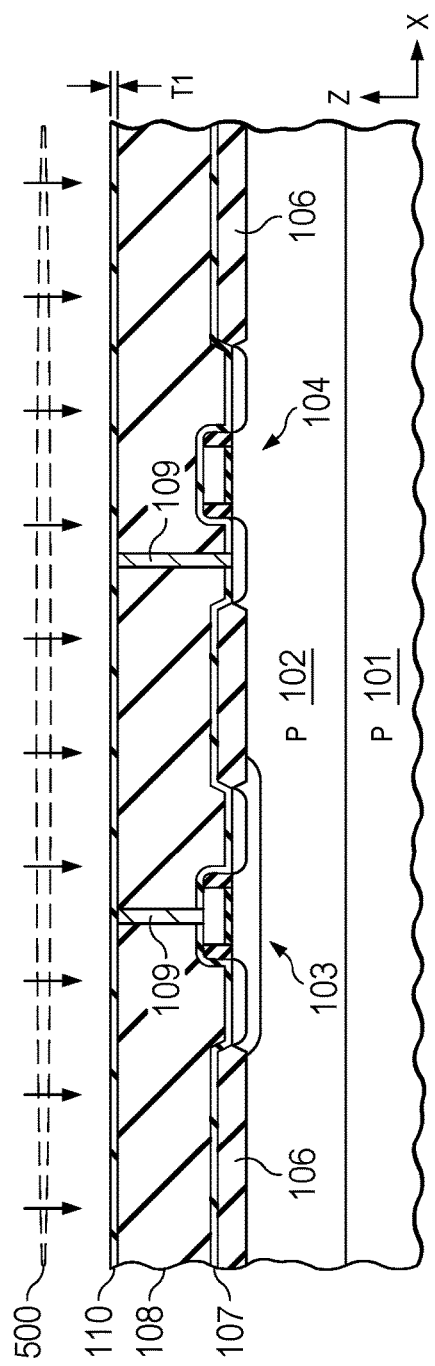

The method 200 in FIG. 2 continues at 220 with first metallization level processing, including depositing a low hydrogen, low leakage etch stop layer at 222. FIG. 5 shows one example, in which a plasma enhanced chemical vapor deposition (PECVD) process 500 is performed that deposits the first etch stop layer 110 on the upper sides of the PMD dielectric layer 108 and the tungsten contacts 109. The first etch stop layer 110 is or includes a low hydrogen, low leakage silicon nitride material (e.g., SiN) or silicon carbon nitride material (e.g., SiCN) having a first bond percentage ratio of ammonia (e.g., N—H such as $NH_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The PECVD deposition process 500 in one example is performed at an ammonia $NH_3$ to silane $SiH_4$ flow ratio of 3.5 or more and 5 or less (e.g., approximately 4.3), and the PECVD deposition process 500 has a dinitrogen $N_2$ to silane $SiH_4$ flow ratio of 50 or more and 70 or less (e.g., approximately 60). In these or other examples, the PECVD deposition process 500 is performed at a pressure of 1.8 Torr or more and 2.6 Torr or less (e.g., approximately 2.25 Torr).

Figure 6:
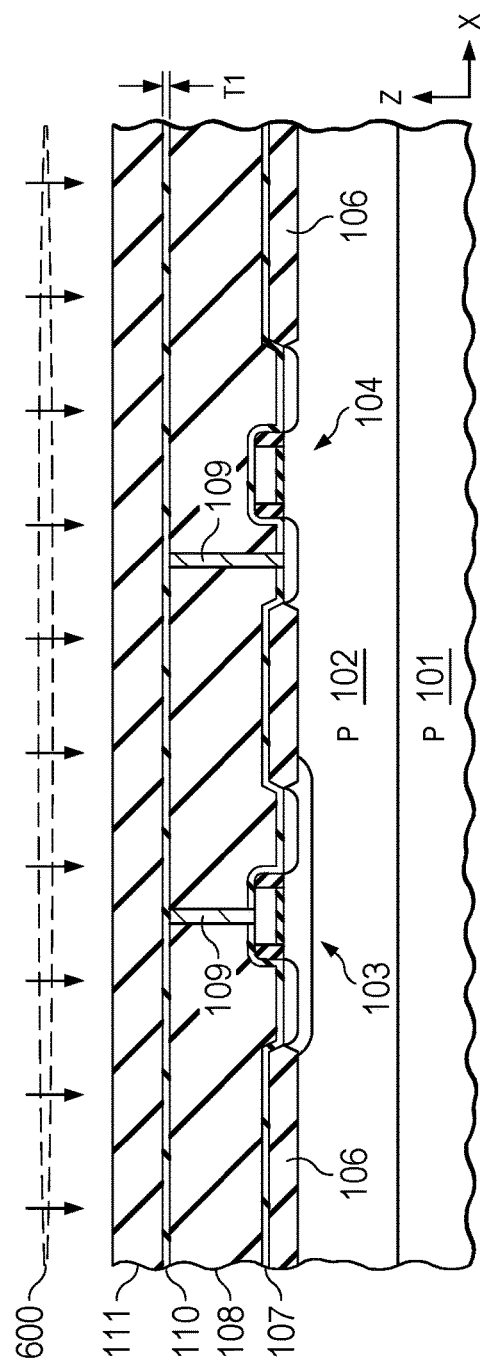
Figure 7:
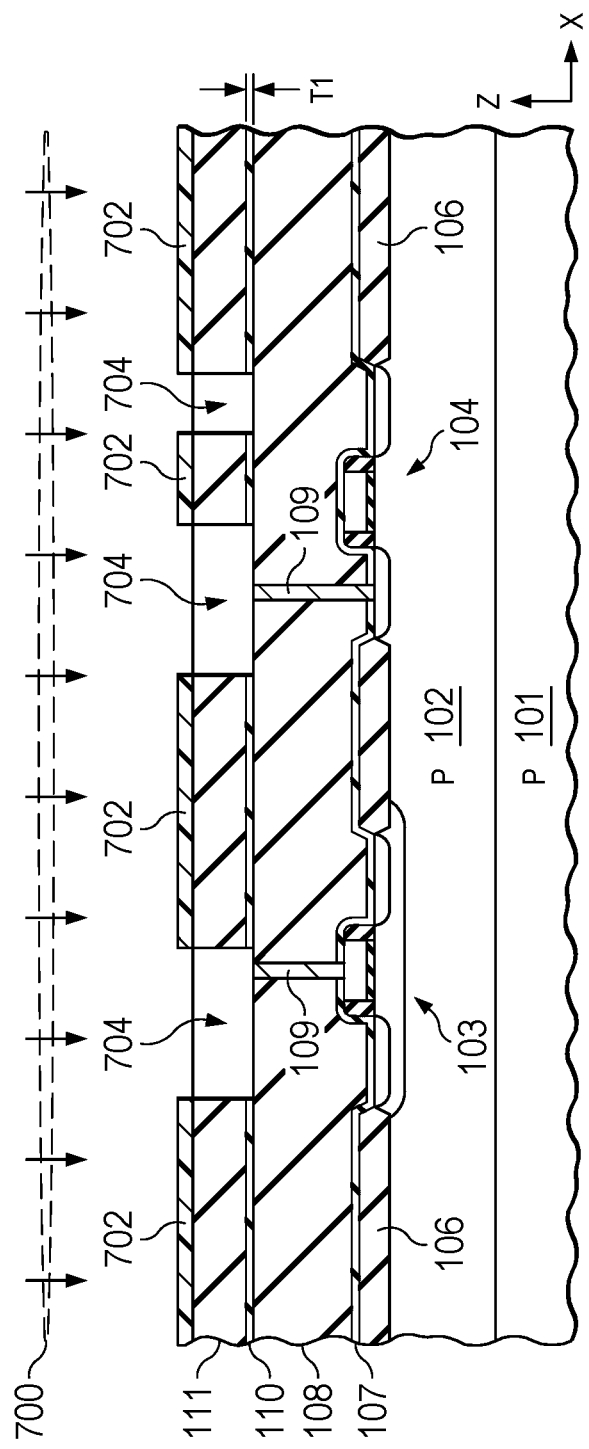
Figure 8:
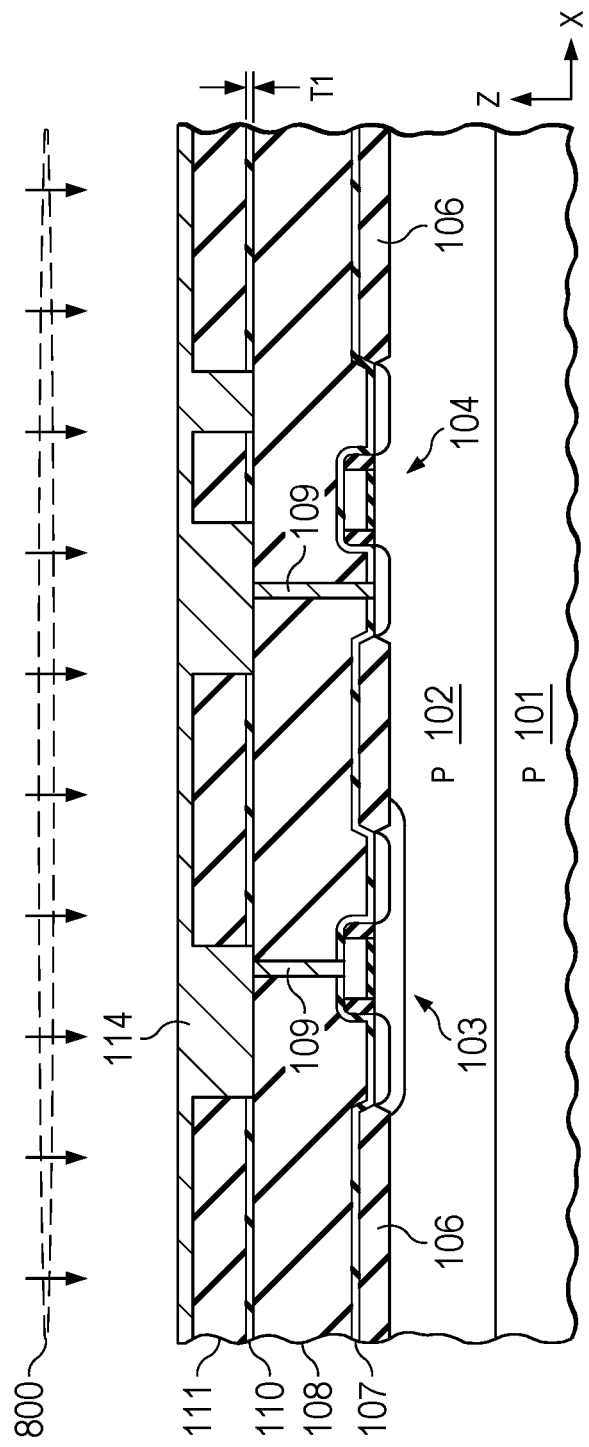
Figure 9:
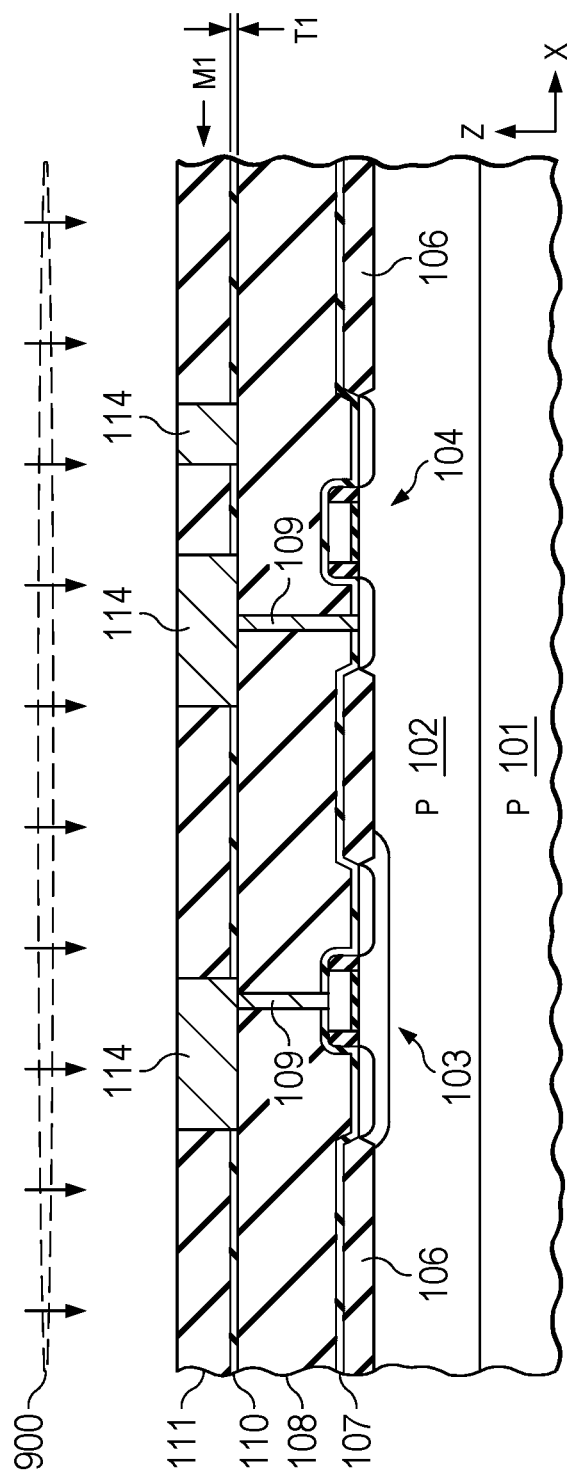

The first level processing at 220 in this example also includes depositing the inter-metal dielectric (IMD) dielectric layer at 223. FIG. 6 shows one example, in which a deposition process 600 is performed that deposits the IMD dielectric layer 111 on the etch stop layer 110. In one example, the IMD dielectric layer 111 is or includes one of fluorosilicate glass (FSG), tetraethyl orthosilicate (TEOS), and silicon oxycarbide (e.g., SiCO). The method 200 also includes patterning and etching at 224 to form the first metal level openings. FIG. 7 shows one example, in which an etch process 700 is performed using a mask 702 that forms opening 704 in the IMD dielectric layer 111. At 225 and FIG. 2, the method 200 also includes depositing copper or other conductive metal to fill the first metal openings. FIG. 8 shows one example, in which an electroplating or other copper deposition process 800 is performed that forms the first metal line features 114 in the previously etched openings of the IMD dielectric layer 111. In this example, the deposition process 800 also forms copper over the top sides of the IMD dielectric layer 111. At 226 in FIG. 2, a planarization (e.g., CMP) is performed. FIG. 9 shows one example, in which a CMP process 900 is performed that planarizes the top side of the wafer to form the top sides of the first metal lines 114 and exposes the top sides of the IMD dielectric layer 111.

Figure 10:
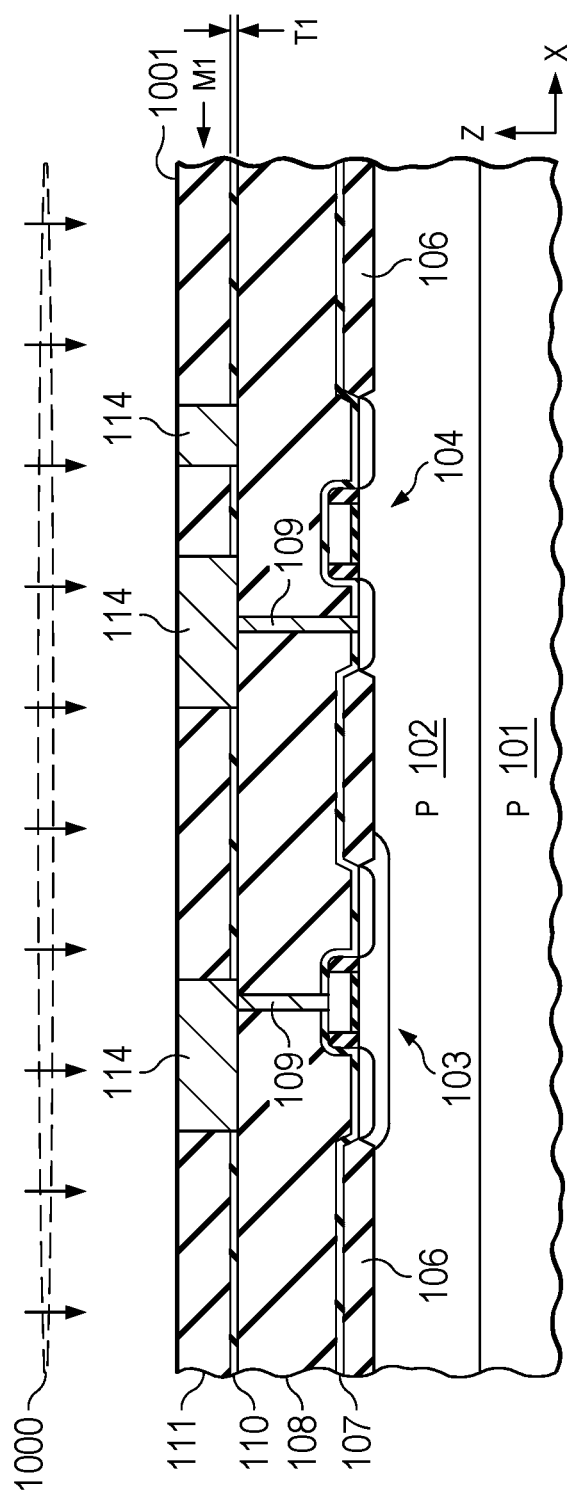

The method 200 continues at 230 in FIG. 2 with processing to form the next metallization structure level. At 231 and 232, a low hydrogen, low leakage silicon nitride or silicon carbon nitride diffusion barrier layer is formed over the planarized IMD level. At 231 in this example, the method 200 includes performing a silane pretreatment that exposes the side of the PMD dielectric layer 111 and the upper sides side of the first metal lines 114 to silane (e.g., $SiH_4$) prior to forming the diffusion barrier layer at 232. FIG. 10 shows one example, in which a silane pretreatment process 1000 is performed that exposes the PMD dielectric layer 111 and the first metal lines 114 to silane. In one example, the silane pretreatment process 1000 exposes the upper side of the first dielectric layer 111 and the upper side of the first metal line 114 to silane (e.g., $SiH_4$) for 0.5 second or more and 2.0 seconds or less. In another example, the silane pretreatment at 231 is omitted.

Figure 11:
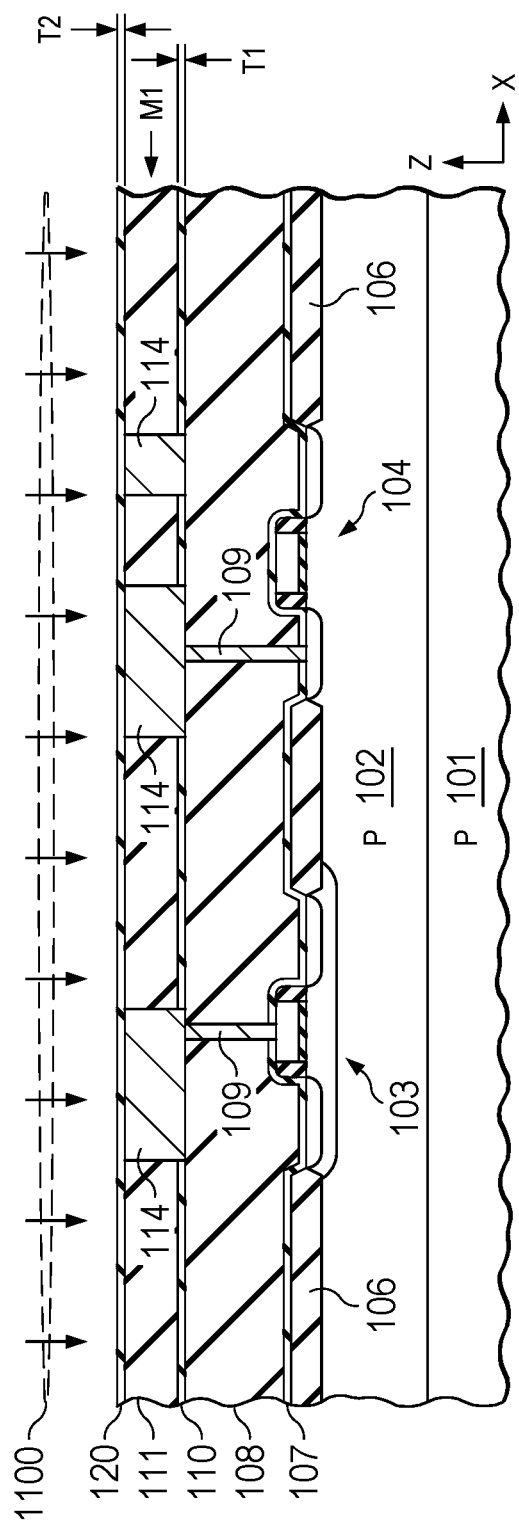

In the illustrated example, after the silane pretreatment at 231, the method continues with depositing a low hydrogen, low leakage diffusion barrier layer at 232. FIG. 11 shows one example, in which a plasma enhanced chemical vapor deposition (PECVD) process 1100 is performed that deposits the first diffusion barrier layer 120 on the upper sides of the IMD dielectric layer 111 and the first metal lines 114. The first diffusion barrier layer 120 is or includes a low hydrogen, low leakage silicon nitride material (e.g., SiN) or silicon carbon nitride material (e.g., SiCN) having a first bond percentage ratio of ammonia (e.g., N—H such as $NH_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). The PECVD deposition process 1100 in one example is performed at an ammonia $NH_3$ to silane $SiH_4$ flow ratio of 3.5 or more and 5 or less (e.g., approximately 4.3), and the PECVD deposition process 1100 has a dinitrogen $N_2$ to silane $SiH_4$ flow ratio of 50 or more and 70 or less (e.g., approximately 60). In these or other examples, the PECVD deposition process 100 is performed at a pressure of 1.8 Torr or more and 2.6 Torr or less (e.g., approximately 2.25 Torr).

Figure 12:
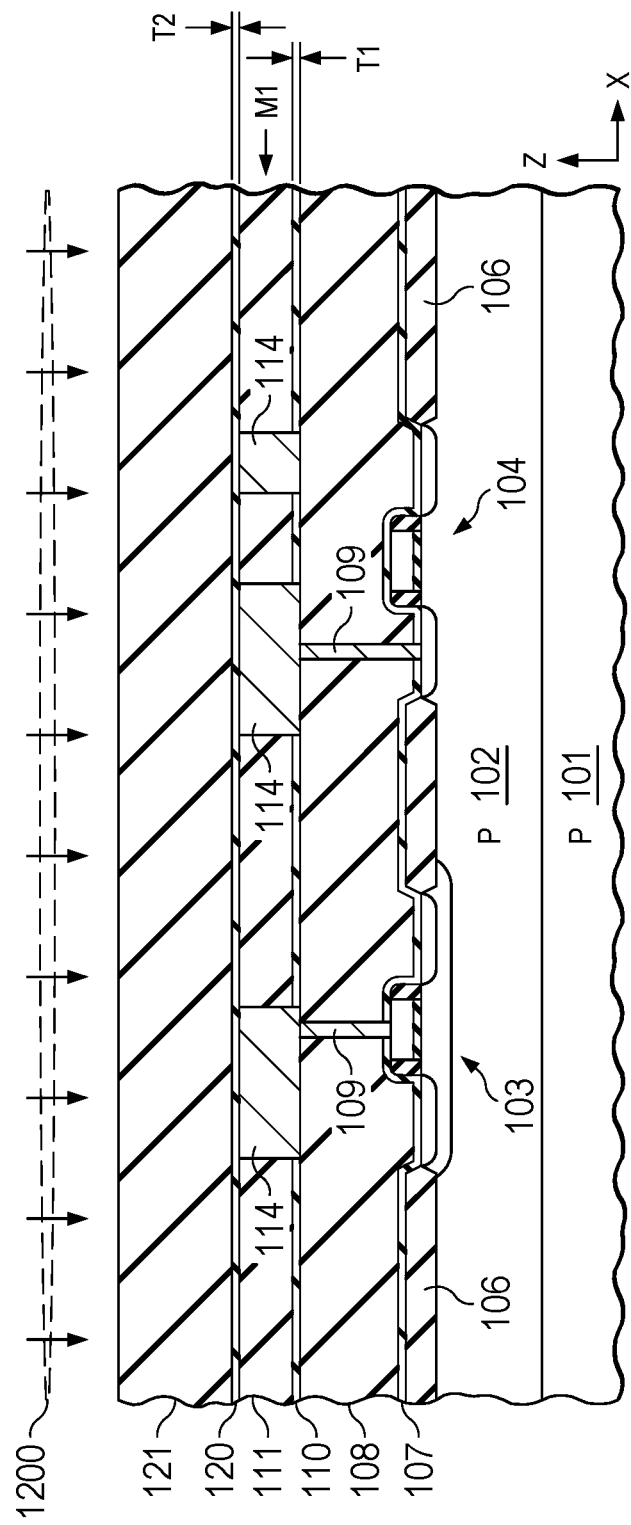
Figure 13:
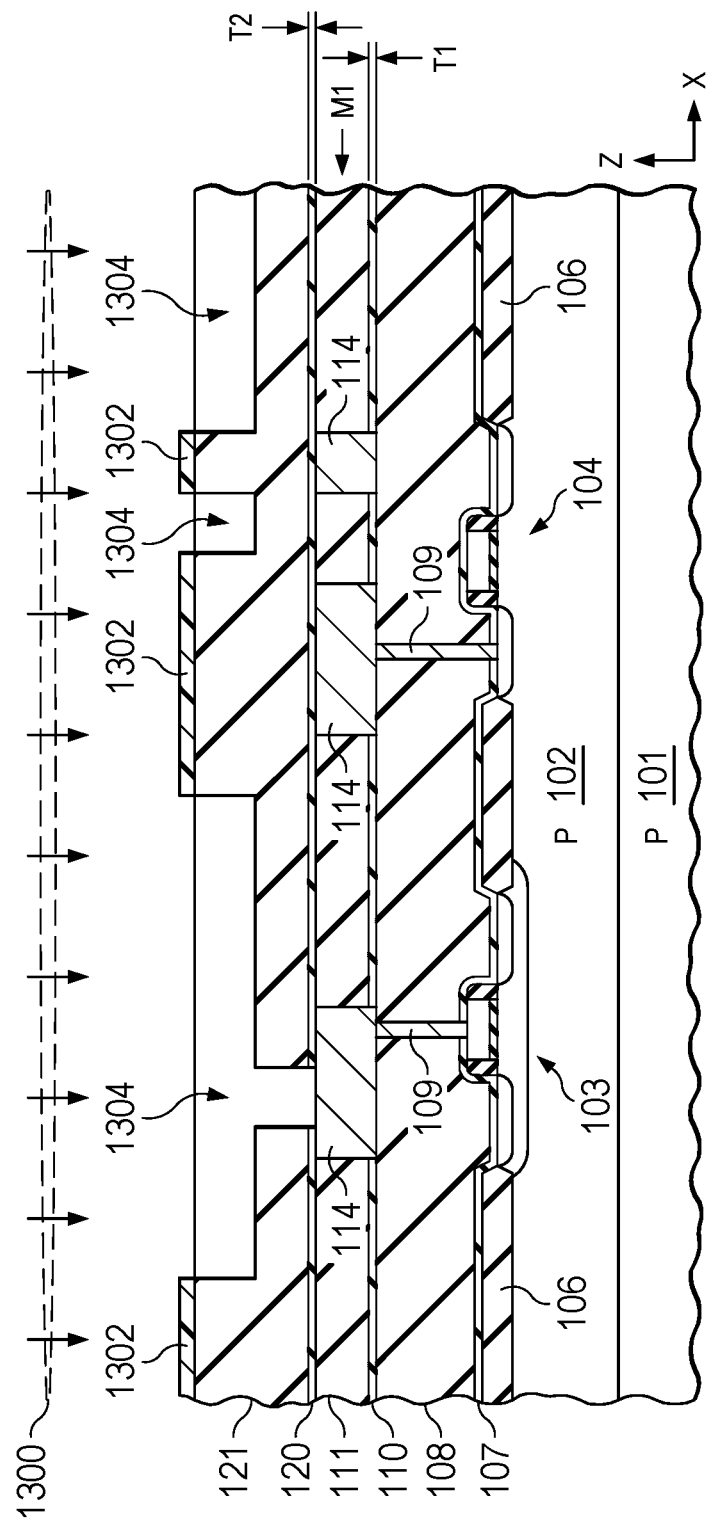
Figure 14:
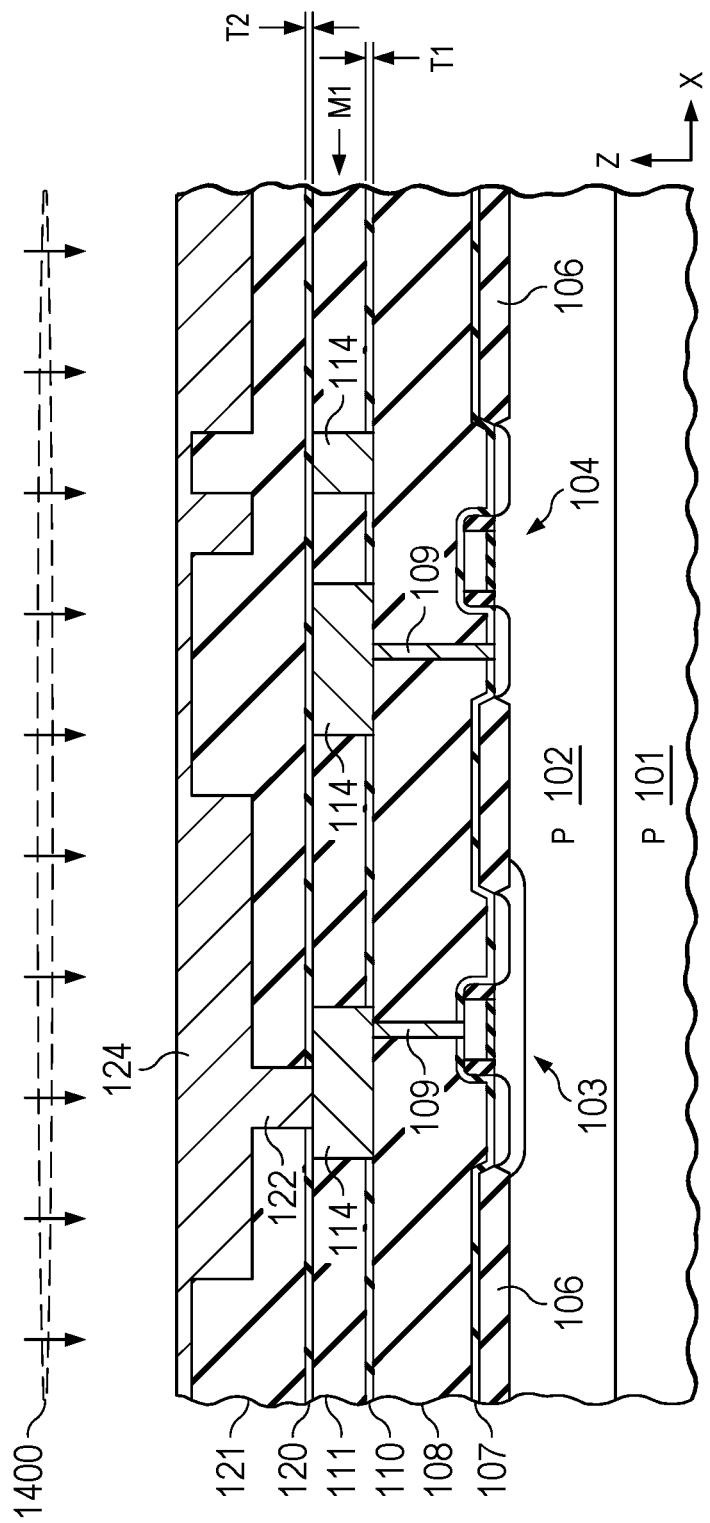
Figure 15:
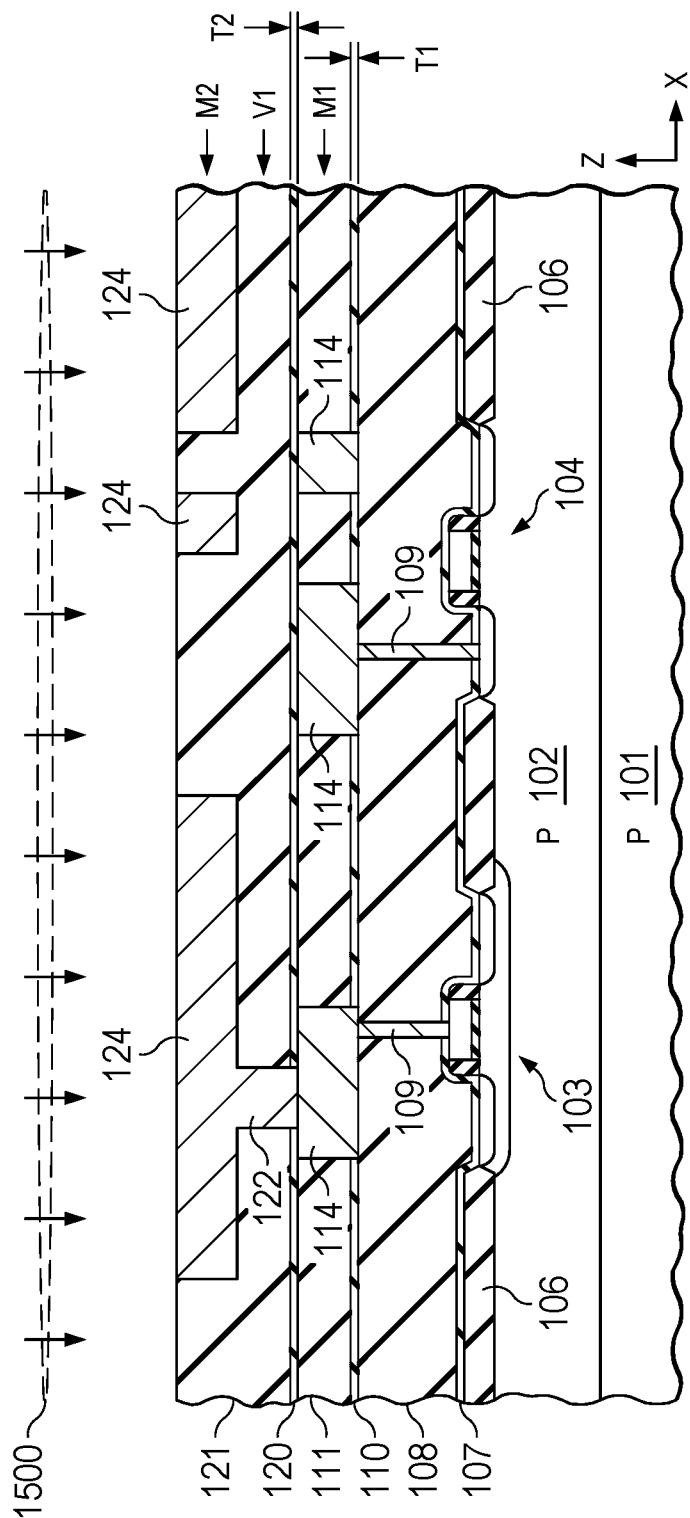

At 233, the ILD dielectric layer 121 is deposited. FIG. 12 shows one example, in which a deposition process 1200 is performed that deposits the ILD dielectric layer 121 on the diffusion barrier layer 120. In one example, the ILD dielectric layer 121 is or includes one of fluorosilicate glass (FSG), tetraethyl orthosilicate (TEOS), and silicon oxycarbide (e.g., SiCO). The method 200 also includes patterning and etching at 234 to form the first via and second metal line openings. FIG. 13 shows one example, in which a dual etch process 1300 is performed using a first mask (not shown) and a second mask 1302. The process 1300 forms openings 1304 in the ILD dielectric layer 121. At 235 and FIG. 2, the method 200 includes depositing copper or other conductive metal to fill the first via and second metal line openings. FIG. 14 shows one example, in which an electroplating or other copper deposition process 1400 is performed that forms the first vias 122 and the second metal line features 124 in the previously etched openings of the IMD dielectric layer 121. In this example, the deposition process 1400 also forms copper over the top sides of the ILD dielectric layer 121. At 236 in FIG. 2, a planarization (e.g., CMP) is performed. FIG. 15 shows one example, in which a CMP process 1500 is performed that planarizes the top side of the wafer to form the top sides of the second metal lines 124 and exposes the top sides of the ILD dielectric layer 121.

In one example, the PECVD processes 500 and 1100 use a high frequency power level of approximately 1070 W at a frequency of approximately 13.56 MHz, and a low frequency power level of approximately 130 W at 400 kHz at a target spacing of approximately 0.6 inches in a Novellus Concept2 Sequel-6 tool, with a deposition rate of approximately 39 Å/S. One implementation of the processes 500, 1100 uses an $NH_3$ flow rate of approximately 750 sccm, a silane (e.g., SiH$_4$) flow rate of approximately 176 sccm, and an N$_2$ flow rate of approximately 14,000 sccm for a final thickness of approximately 600 Å and a SiN diffusion barrier material 110, 120, 130, 140, 150, and/or 160 having a first bond percentage ratio of ammonia (e.g., N—H such as NH$_3$) to silicon nitride (e.g., Si—N) that is greater than a second bond percentage ratio of silicon hydride (e.g., SiH) to silicon nitride (e.g., SiN). The first bond percentage ratio may, for example, be 6.5% or more and 10% or less (e.g., approximately 8) and the second bond percentage ratio may be, for example, 1.5% or more and 1.9% or less (e.g., approximately 1.7). In this or another example, the first etch stop layer 110 may have a refractive index of 1.93 or more and 1.96 or less (e.g., approximately 1.93). In these or other examples, one or more of the etch stop/diffusion barrier layers 110, 120, 130, 140, 150, and/or 160 have a third bond percentage ratio of NH to SiH of approximately 4.

Figure 16:
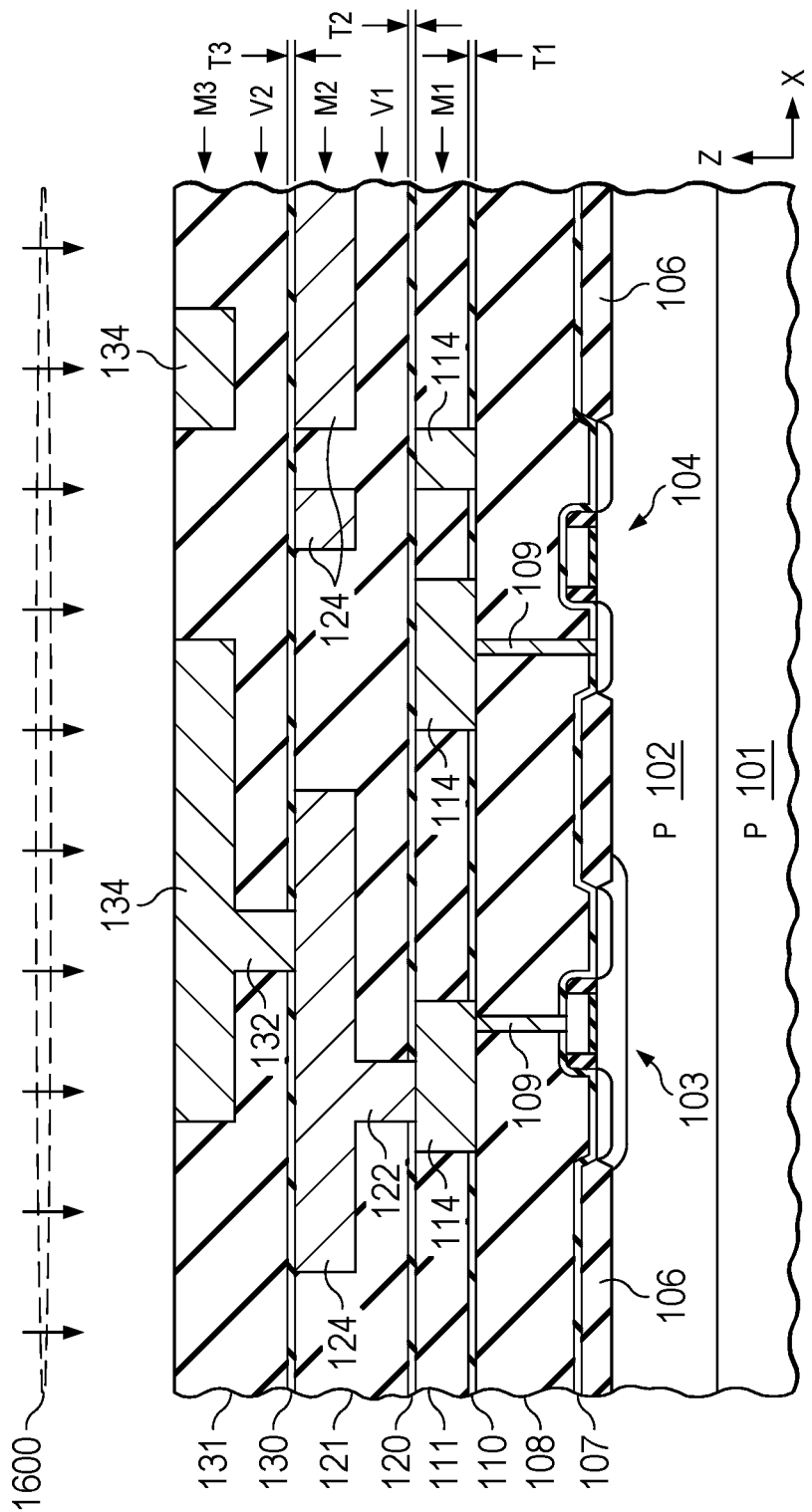
Figure 17:
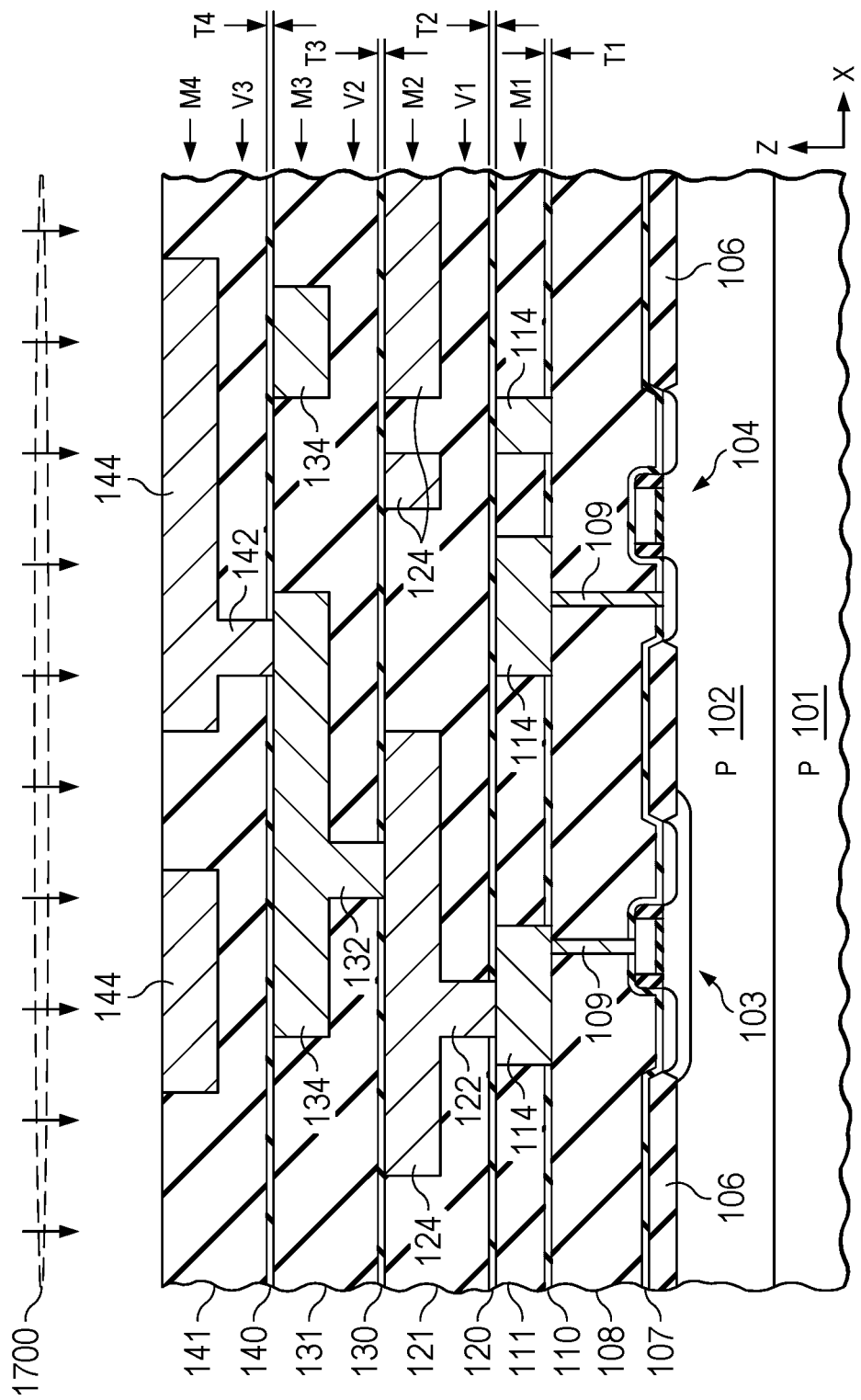
Figure 18:
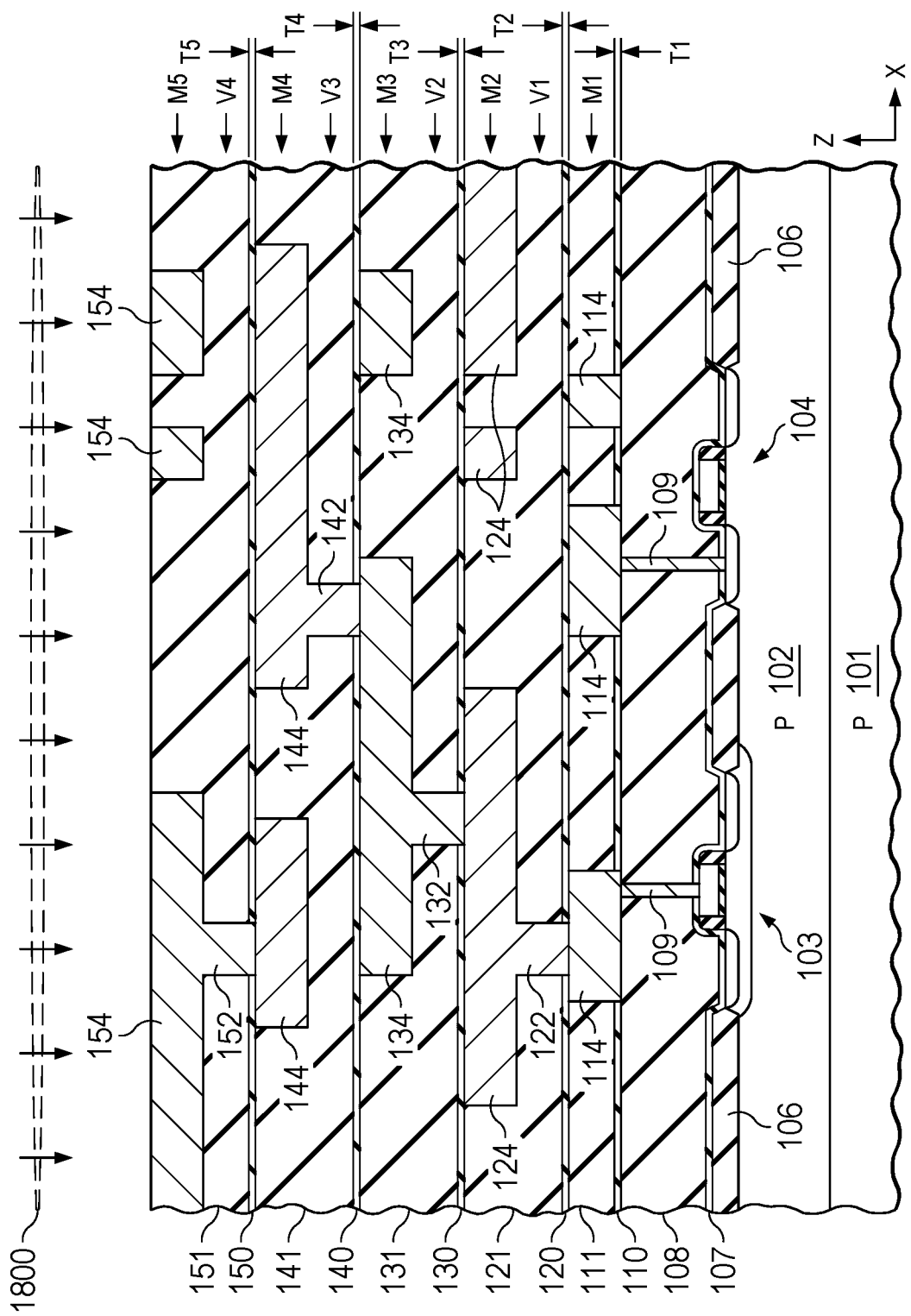

A determination is made at 240 as to whether further metallization levels remain to be fabricated. If so (YES at 240), the method 200 returns to repeat the processing at 230 for the next metallization interconnect level. FIG. 16 shows one example of the further processing at 230 to form the next ILD dielectric layer 131, the second vias 132, and the third metal lines 134. Another level is then formed in the illustrated example at 230 in FIG. 2, as shown in FIG. 17, and FIG. 18 shows the wafer after a still further iteration at 230 to form the final interconnect level. Once all the desired levels are completed (NO at 240), the method 200 proceeds at 242 with formation of the protective overcoat layers and bond pads or cap layers (e.g., 162, 164, and 166 in FIG. 1 above), individual dies are separated from the wafer at 224 (e.g., semiconductor die 180 in FIGS. 1 and 1A), and the dies are packaged at 246 to provide packaged electronic devices (e.g., ICs) at 246.

Figure 19:
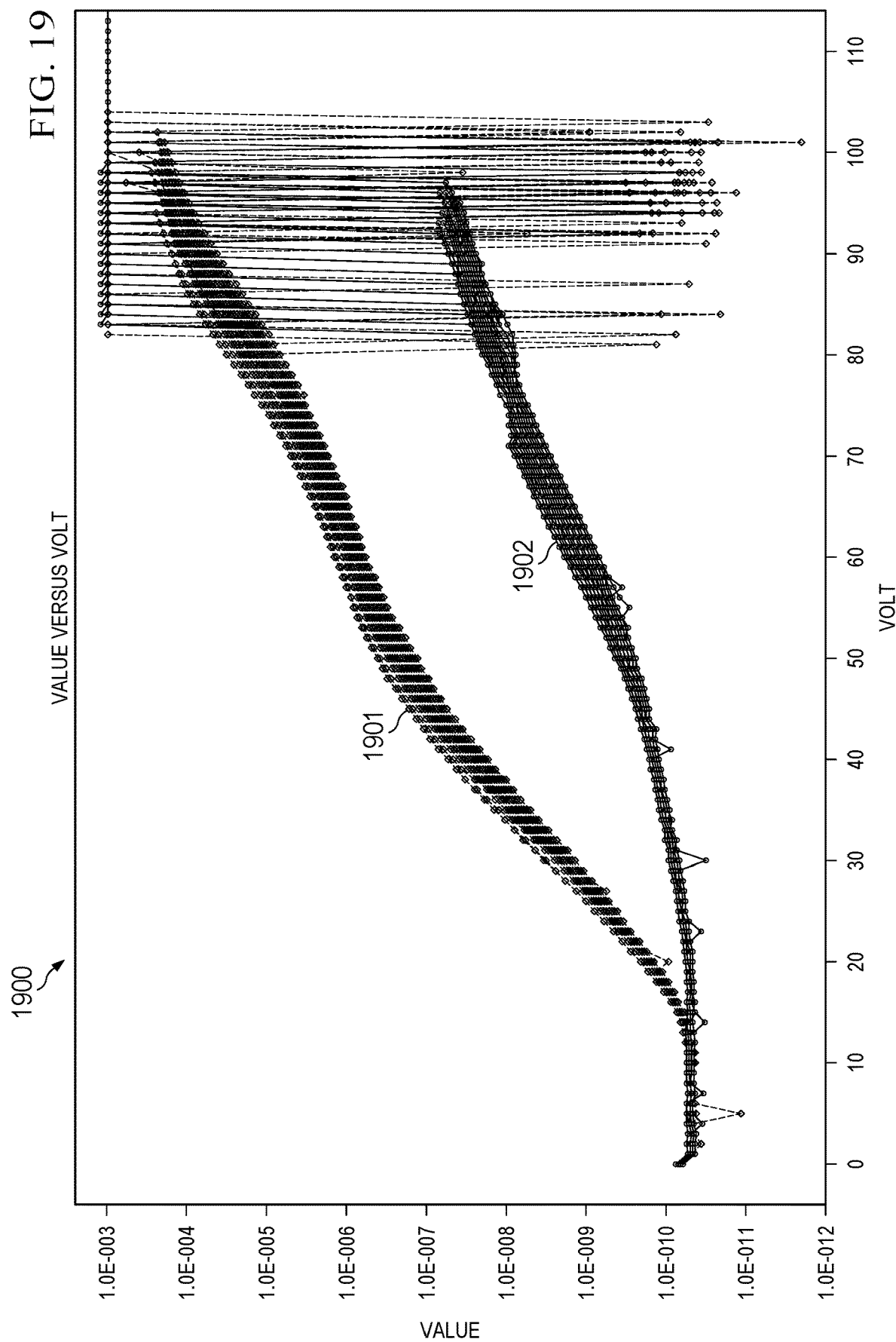
FIGS. 19 and 20 show comparative current leakage performance data for intra-metal and inter-metal leakage.
Figure 20:
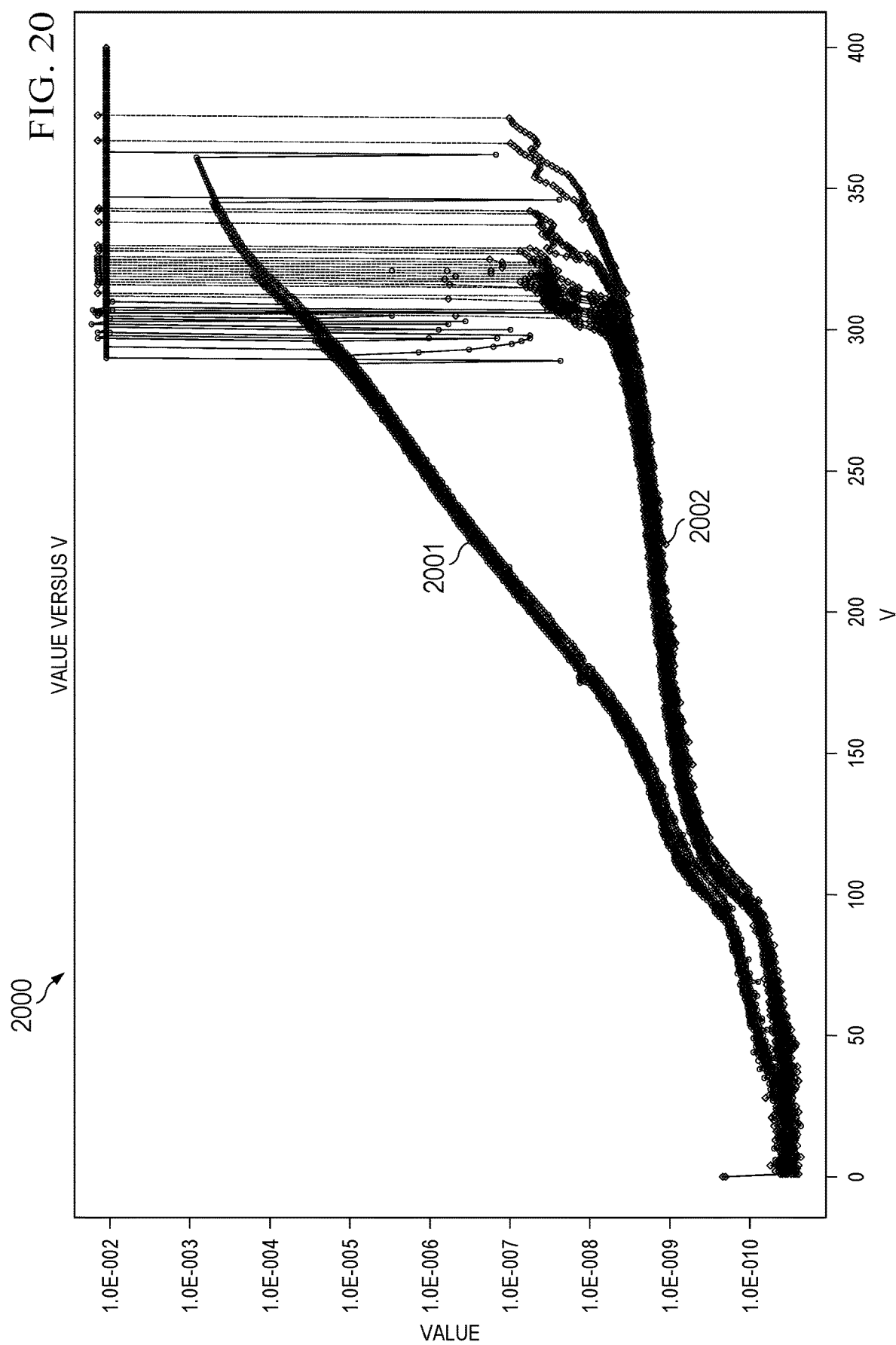

FIGS. 19 and 20 show respective graphs 1900 and 2000 that illustrate comparative current leakage performance data for intra-metal and inter-metal leakage. In the illustrated examples, lower NH$_3$/SiH$_4$ but higher N$_2$ flows in the deposition of the diffusion barrier layers 110, 120, 130, 140, 150, and/or 160 produce SiN film with fewer SiH bond and more NH bonds. The graph 1900 in FIG. 19 shows a baseline current-voltage (I-V) curve 1901 and an I-V curve 1902 for example low hydrogen, low leakage silicon nitride diffusion barrier layers (e.g., 110, 120, 130, 140, 150, and/or 160) showing significant reduction in intra-metal leakage current as a function of applied voltage. The graph 2000 in FIG. 20 shows a baseline current-voltage (I-V) curve 2001 and an I-V curve 2002 for example low hydrogen, low leakage silicon nitride diffusion barrier layers (e.g., 110, 120, 130, 140, 150, and/or 160) showing significant reduction in combined inter-metal and intra-metal leakage current as a function of applied voltage with generally increased breakdown voltage (BV) levels. The graphs 1900 and 2000 demonstrate advantages and benefits facilitating increased operating voltage ratings and almost 100 percent leakage reduction for operating voltages of approximately 40 V. The use in some examples of the silane pretreatment (e.g., at 231 in FIG. 2) enhances the benefits with respect to metallization structures. In this regard, conventional low hydrogen films were found to have lower leakage but poor interface properties with copper, and hence poor electromigration performance. Thus, while those films might serve as a hydrogen barrier for ferroelectric memories or other circuits, these types of films were believed to be unsuitable as effective diffusion barriers, particularly for use in contact with copper features of a multilevel metallization interconnect structure. Short silane and ammonia pretreat helps improve conditions to improve interface adhesion and thus provide an effective copper diffusion barrier as well as a useful etch stop layer as evident through electrical monitor yields of via chain with wide metal links. Further benefits include enhanced pretreat with limited impact to resistance but good adhesion, low leakage due to stoichiometry of the film, lower free hydrogen for potential device stability improvement, and denser dielectric film to reduce copper hillocks.

Modifications are possible in the described examples, and other implementations are possible, within the scope of the claims.

What is claimed is:

1. A method of fabricating an electronic device, the method comprising:
    forming a diffusion barrier layer on a side of a first dielectric layer and on a side of a metal line, the diffusion barrier layer including silicon nitride material, the diffusion barrier layer formed by a plasma enhanced chemical vapor deposition (PECVD) process that deposits the diffusion barrier layer on the side of the first dielectric layer and the side of the metal line, the PECVD process having an ammonia to silane flow ratio of 3.5 or more and 5 or less, and the PECVD process having a dinitrogen to silane flow ratio of 50 or more and 70 or less; and
    forming a second dielectric layer on the diffusion barrier layer.

2. The method of claim 1, wherein the metal line includes copper.

3. The method of claim 1, further comprising:
    performing a silane pretreatment that exposes the side of the first dielectric layer and the side of the metal line to silane before forming the diffusion barrier layer.

4. The method of claim 3, wherein the silane pretreatment exposes the side of the first dielectric layer and the side of the metal line to silane for 0.5 second or more and 2.0 seconds or less.

5. The method of claim 1, wherein the silicon nitride material has a first bond percentage ratio of ammonia to silicon nitride of 6.5% or more and 10% or less, and a second bond percentage ratio of silicon hydride to silicon nitride of 1.5% or more and 1.9% or less.

6. The method of claim 1, wherein the PECVD process is performed at a pressure of 1.8 Torr or more and 2.6 Torr or less.

7. The method of claim 1, wherein the diffusion barrier layer further includes carbon.

8. The method of claim 1, wherein the first and second dielectric layers comprise one of fluorosilicate glass, tetraethyl orthosilicate, and silicon oxycarbide.

9. A method of fabricating a semiconductor device, the method comprising:
    forming a silicon nitride layer on a first dielectric layer, wherein the silicon nitride layer formed by a chemical vapor deposition (CVD) process including:
        an ammonia to silane flow ratio of 3.5 or more and 5 or less; and
        a dinitrogen to silane flow ratio of 50 or more and 70 or less; and
    forming a second dielectric layer on the silicon nitride layer.

10. The method of claim 9, wherein the silicon nitride layer further forms on a metal structure.

11. The method of claim 10, wherein the metal structure includes copper or aluminum.

12. The method of claim 9, further comprising:
performing a pretreatment process to the first dielectric layer, wherein the pretreatment process exposes the first dielectric layer to silane prior to forming the silicon nitride layer.

13. The method of claim 12, wherein the pretreatment process lasts for 0.5 second or more and 2 seconds or less.

14. The method of claim 9, wherein the silicon nitride layer includes a first bond percentage ratio of ammonia to silicon nitride greater than a second bond percentage ratio of silicon hydride to silicon nitride.

15. The method of claim 14, wherein:
the first bond percentage ratio of ammonia to silicon nitride ranges between 6.5% and 10%; and
the second bond percentage ratio of silicon hydride to silicon nitride ranges between 1.5% and 1.9%.

16. The method of claim 9, wherein the CVD process is performed at a pressure of 1.8 Torr or more and 2.6 Torr or less.

17. The method of claim 9, wherein the CVD process includes:
an ammonia flow rate of approximately 750 sccm; and
a silane flow rate of approximately 176 sccm.

18. The method of claim 9, wherein the silicon nitride layer has a refractive index of 1.93 or more and 1.96 or less.

19. The method of claim 9, wherein the silicon nitride layer includes carbon.

20. The method of claim 9, wherein the first and second dielectric layers comprise one of fluorosilicate glass, tetraethyl orthosilicate, and silicon oxycarbide.

* * * * *